(12) United States Patent
Hakonen et al.

(10) Patent No.: US 7,550,759 B2
(45) Date of Patent: Jun. 23, 2009

(54) CAPACITIVE SINGLE-ELECTRON TRANSISTOR

(75) Inventors: Pertti Hakonen, Helsinki (FI); Mika Sillanpaa, Espoo (FI); Leif Roschier, Vantaa (FI)

(73) Assignee: MagiQ Technologies, Inc., New York, NY (US)

( * ) Notice: Subject to any disclaimer, the term of this patent is extended or adjusted under 35 U.S.C. 154(b) by 355 days.

(21) Appl. No.: 11/630,014

(22) PCT Filed: Jul. 18, 2005

(86) PCT No.: PCT/FI2005/000331

§ 371 (c)(1),
(2), (4) Date: Dec. 18, 2006

(87) PCT Pub. No.: WO2006/008335

PCT Pub. Date: Jan. 26, 2006

(65) Prior Publication Data

US 2007/0263432 A1 Nov. 15, 2007

(30) Foreign Application Priority Data

Jul. 19, 2004 (FI) .................................. 20041000

(51) Int. Cl.
*G01R 29/00* (2006.01)
*H01L 29/06* (2006.01)
(52) U.S. Cl. ........................ 257/24; 324/157; 324/158.1
(58) Field of Classification Search ................ 324/157, 324/158.1; 257/24
See application file for complete search history.

(56) References Cited

U.S. PATENT DOCUMENTS

| | | | |
|---|---|---|---|
| 6,353,330 | B1 | 3/2002 | Kanda et al. |
| 6,605,822 | B1 | 8/2003 | Blais |
| 2002/0188578 | A1 | 12/2002 | Amin |
| 2003/0207766 | A1 | 11/2003 | Esteve |
| 2004/0012407 | A1 | 1/2004 | Amin |

*Primary Examiner*—Evan Pert
(74) *Attorney, Agent, or Firm*—Opticus IP Law, PLLC

(57) ABSTRACT

The invention is a sensitive measuring instrument, which is principally applied to quantum computation, especially to measurement of quantum bits consisting of superconducting micro and nano-structures. The state of a quantum bit is expressed as the voltage-time integral over a circuit component. Phase measurement is performed by measuring the capacitance of a single-electron transistor between the gate and ground.

9 Claims, 4 Drawing Sheets

CAPACITIVE SINGLE-ELECTRON TRANSISTOR

CLAIM OF PRIORITY

This application hereby claims priority under 35 USC §119 based on Finnish patent application serial no. FI 20041000, entitled "Kapasitiivinen yhden elektronin transistori," filed on Jul. 19, 2004, and having issued on January 20, 2006 as Finnish Patent No. 117032B, which patent application and patent are incorporated by reference herein.

FIELD OF THE INVENTION

The invention is a sensitive measuring instrument principally implemented in the domain of quantum computation, especially in the measurement of quantum bits consisting of superconducting micro and nano-structures.

BACKGROUND ART

Whereas a bit, the basic unit of digital electronics, always has the value 0 or 1 because of binary logic, a quantum bit, the basic unit of quantum calculation, may be a random combination, i.e. a superposition of the values 0 and 1. The mathematic expression of the state of a quantum bit is $a|0>+b|1>$, in which a and b are complex numbers meeting the equation $|a|^2+|b|^2=1$ and in which the quantum states $|0>$ and $|1>$ correspond to the values 0 and 1 of an ordinary bit.

So far, no real quantum computer has been conceived or constructed, although research is being done in this domain from the aspects of different disciplines. The rapidly increasing interest in recent years is explained by a desire to achieve a revolution in digital data processing. A computer operating on the conventional principle utilises fixed feed data, whereas a quantum computer employs the superposition principle of quantum mechanics, enabling it to calculate different combinations of all possible feed data by one single operation different in parallel computation. This enables a quantum computer to perform laborious calculations, which would be impossible for ordinary computers having ever so high speed. Such calculations include factor division of a high number, involving the problem of data protection in modern society, and simulation of quantum mechanical systems, which opens vertiginous perspectives in the study of the genesis of life and the origin of diseases, for instance.

The computing steps are followed by a measurement of the quantum state of quantum bits. In the measurement process, the quantum state of the quantum bit collapses according to quantum mechanic principles from the superposition state $a|0>+b|1>$ either to the basic state $|0>$ or the basic state $|1>$. The prime application of this invention is its potential of rapid and accurate measurement of quantum bits of a certain type. Measurement of the state of quantum bits in superconducting nano-structures has proved at least equally difficult as their use for computing operations.

In a superconductor, the electrons appear as so-called Cooper pairs, which are loosely bound coherent electron pairs, i.e. pairs vibrating at the same rate. The supercurrent of a Cooper pair passes without energy losses, and this is essential in maintaining the coherence of a quantum bit. A superconducting current may additionally penetrate through an insulation having a thickness of about 1-2 nanometres owing to the tunnelling phenomenon of quantum mechanics. Such a structure is called a tunnel junction. The energy of a tunnelling supercurrent is described by the term Josephson energy $E_J$, which is the higher, the stronger the tunnelling current. If a Cooper pair is brought to a superconductor island of the size of approx. one micrometer, the accomplished work, which is described by the term Cooper pair charging energy $E_{CP}$, may be greater than the energy of the thermal vibrations at a sufficiently low temperature. At temperatures clearly below one Kelvin, which are obtained by straightforward cooling methods, such as eluting coolers, $E_{CP}$ and $E_J$ are the highest energies and hence phenomena relating to these are predominant in physical processes.

A phase-quantum bit is a superconducting quantum bit. A supercurrent induced in a current loop made of superconducting material proceeds in the loop in principle over any distance. The basic states $|0>$ and $|1>$ of a phase-quantum bit are associated with the direction of the current circulating in the superconducting loop containing tunnel junctions. A phase-quantum bit is generally characterised by the condition $E_{CP}<<E_J$. The phase $\Phi$ over a circuit component is defined as the time integral of the voltage V with the equation:

$$\phi = \frac{2e}{\hbar} \int_0^t dt' V(t') \qquad (1)$$

in which e is the charge of the electron and h is Planck's constant. The phase and the current I are interconnected by the inductance L, $\phi=2\pi/\phi_0 LI$, in which $\phi_0$ is the basic unit of the magnetic flux, and hence measurement of the phase expresses the direction of the current/i.e. the state of the quantum bit.

A second superconducting quantum bit is a charge-quantum bit, for which $E_{CP} \approx E_J$.

A tunnel junction on nanoscale may have sufficient Cooper pair charge energy in order to meet this condition. The states $|0>$ and $|1>$ of the charge-quantum bit correspond to the fact whether the superconductor island defined by one or more tunnel junctions has zero or one Cooper pair relative to a charge neutral situation. For measurement of the state of a charge-quantum bit, a sensitive electric charge measurement instrument is needed, i.e. an electrometer, such as rf-SET or L-SET.

The charge-phase quantum bit is perhaps the most interesting superconducting quantum bit. As in the case of a charge-quantum bit, the computing operations of a quantum bit are performed by charge signals. Measurement, again, is performed in principle in the same way as for a phase-quantum bit, i.e. by measuring the phase over the quantum bit, because the states $|0>$ and $|1>$ involve different phases. For the measurement, the quantum bit in the original application is short-circuited by a superconducting loop having one large-sized tunnel junction. The measurement has been performed by conducting a current pulse to the structure. Depending on the state of the quantum bit, the current of the large-sized tunnel junction either exceeds or does not exceed a critical value, so that a voltage is or is not generated over the structure. This voltage is the final variable indicating the state of the charge-phase quantum bit in the measurement method of the original solution.

The operation of all of the quantum bits mentioned above have been experimentally proved as individual elements of quantum logics. One has recently even managed to interconnect two charge-quantum bits, thus achieving a very elementary quantum computer processor.

SUMMARY OF THE INVENTION

The invention relates to a capacitive single-electron transistor (C-SET) detector adapted to detect the phase of a qubit that has states defined by different phase, wherein the phase is a physical variable defined under the equation (1), above and discussed in greater detail below. The main application of a C-SET is reading a quantum bit and acting as a reader.

Besides appreciable sensitivity, the C-SET detector of the present invention has the substantial benefit of absence of internal energy losses and internal noise sources. This means that the C-SET detector only minimally interferes with the quantum system being measured and is thus suitable for surveying and utilizing weak quantum mechanical phenomena. The C-SET detector of the present invention can also be produced in a size smaller than current phase meters by several orders of magnitude, thus allowing high precision and integration density.

Accordingly, a first aspect of the invention is a method of determining a phase of a qubit having states defined by different phases. The method includes establishing the qubit in a superconducting single-electron transistor (SSET), wherein the SSET has a gate, a ground and a capacitance. The method also includes measuring the capacitance of the SSET between the gate and ground. The method further includes determining the phase from the measured gate-to-ground capacitance.

Another aspect of the invention is a capacitive single-electron transistor (C-SET) detector circuit apparatus for measuring a phase of a qubit having states defined by different phases. The apparatus includes a SSET adapted to support the qubit, the SSET having a ground, a source, a drain, a gate having an associated gate voltage and an associated gate-to-ground capacitance ($C_G$), and a source-drain phase difference ($\phi$) that corresponds to the gate-to-ground capacitance and that corresponds to said qubit phase. The apparatus also includes a resonance circuit electrically connected to the gate of the SSET. The resonance circuit is adapted to have a resonance frequency that depends on said gate-to-ground capacitance so that measuring the resonance frequency yields the qubit's phase and thus its state.

BRIEF DESCRIPTION OF THE DRAWINGS

The operation of the invention is explained below with reference to the accompanying drawings, in which.

DETAILED DESCRIPTION OF THE INVENTION

Single-electron transistor SET

Phenomena occurring on a scale under one micrometer are usually referred to as mesoscopic phenomena. The size of individual atoms, a number of Angstroms, is still several orders of magnitude smaller. However, quantum mechanical phenomena can be detected at low temperatures in mesoscopic electroconductive metal or semiconductor structures. In the case of superconducting metal structures, the scale is less than one degree Kelvin. The term mesoscopic can roughly be used as a synonym of the word nano.

The mesoscopic basic instrument is the single-electron transistor (SET), which consists of two tunnel junctions having a cross-sectional area of about 10,000 square nanometres. The sum capacitance of these tunnel junctions, which is marked with the symbol $C_\Sigma$, is of the order of magnitude of a femtofarad. If the charge energy $E_{CP}=(2e)^2/2C_\Sigma$ of the Cooper pair is much above the temperature, i.e. $E_{CP} \gg k_B T$, the SET acts as the most sensitive electric charge detector known. It has been indicated to have charge sensitivity of the order of $10^{-6}$ e/$\sqrt{Hz}$, one millionth of the electron charge being measurable in the course of one second.

High-Frequency SET Transistors

For the wide bandwidth of about 10 GHz of a SET detector to be utilised, two techniques have been developed, in which the SET is read by means of an LC oscillator constructed from macroscopic components connected to it. A radio-frequency single-electron transistor (rf-SET) is based on the dependency between the resistance of a non-superconducting SET and the charge to be measured. The modification of the resistance modulates the Q value of the oscillator. The rf-SET has been the only instrument allowing real-time observation of the movement of charges in the megahertz frequency range. This is important in terms of the characterisation and measurement of charge-quantum bits.

Figure 2:
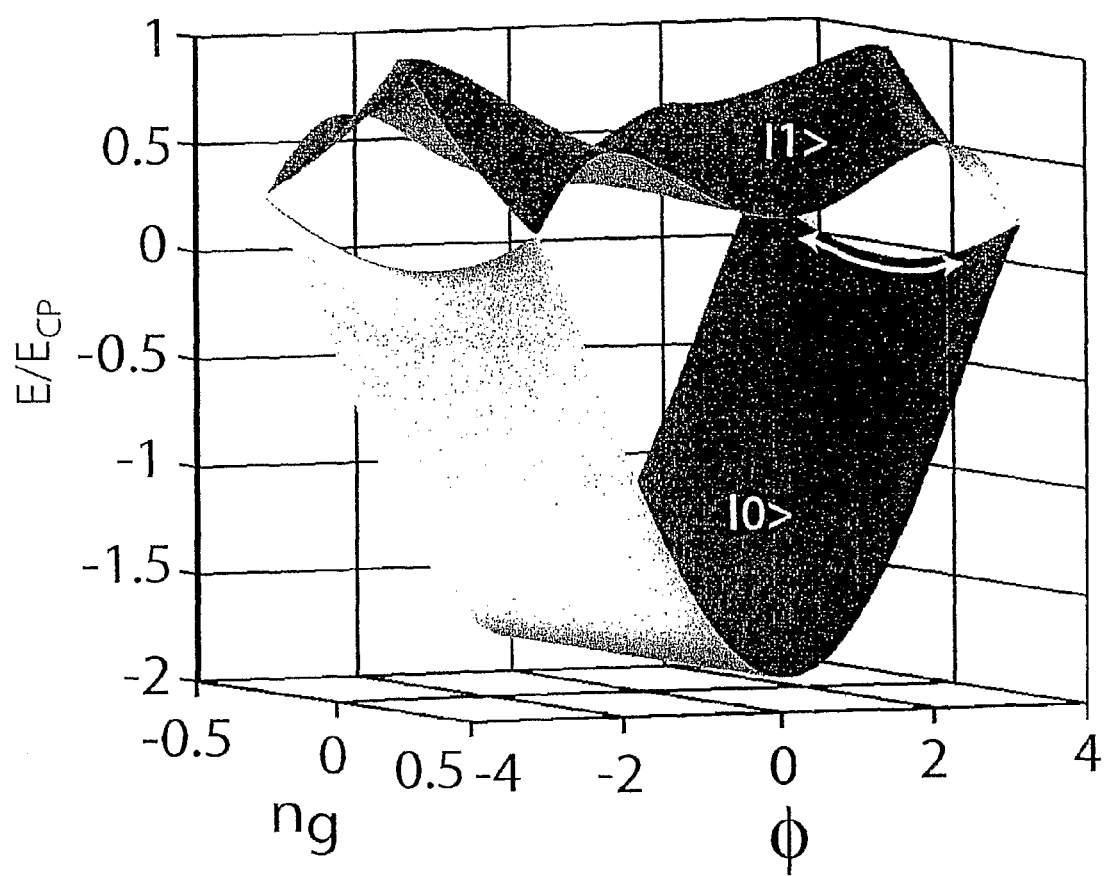
FIG. 2 is a three-dimensional plot with axes $E/E_{cp}$ (the SSET energy normalized to the cooper pair charging energy) vs. $\phi$ (the drain-source phase difference) vs. $n_g$ (the reduced gate charge) that illustrates the energy belts of a superconducting single-electron transistor (SSET)

Due to the limitations caused by the dissipative nature of an rf-SET, non-dissipative L-SET (inductive SET) techniques have recently been developed. Due to the absence of direct-current bias voltage, the energy levels of a superconducting SET (SSET) form energy belts (FIG. 2). In the lowermost belt, the energy amount increases quadratically as a function of the phase $\phi$ during the passage to either direction from the minimum energy point $\phi=0$. This type of dependency is specific for inductance. In addition, in a SSET, the inductance value depends on the gate charge $Q_g$ of the SSET. The operation of the L-SET is based on the fact that the resonance frequency of the oscillator formed by the SSET and the LC circuit depends on $Q_g$. In principle, this allows reactive measurement of the charge, i.e. without energy losses and detrimental noise.

US patent application 2003207766 A1 discloses a phase-charge quantum bit. A solution of an instrument for controlling and measuring superconducting current, in turn, is disclosed in U.S. Pat. No. 6,353,330 B1.

C-SET

Figure 1:
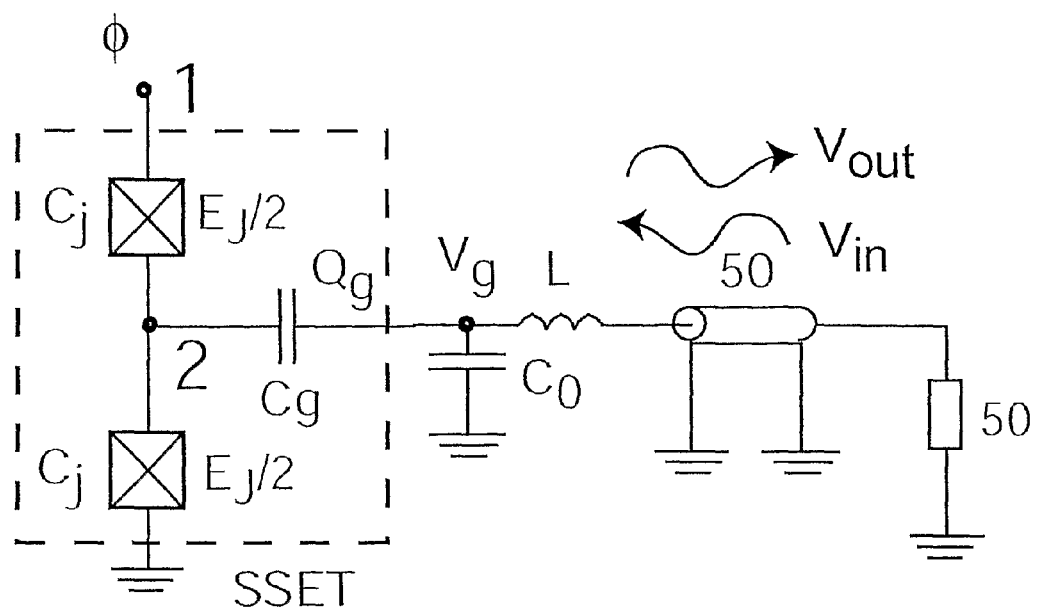
FIG. 1a illustrates an example embodiment of a configuration of a C-SET apparatus according to the present invention, in which a superconducting single-electron transistor (SSET) is connected through its gate to a special resonance circuit.
FIG. 1b illustrates an equivalent configuration to the C-SET apparatus shown in FIG. 1a, in which the SSET behaves as a capacitance CG.
Figure 1:
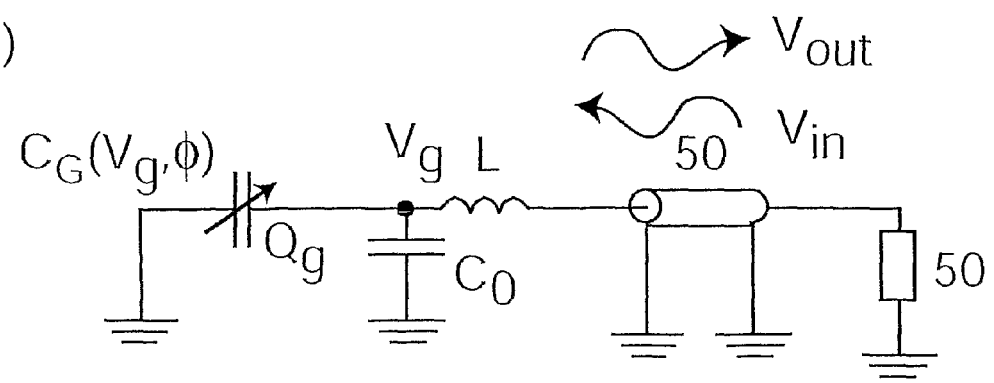

The energy of the SSET increases quadratically as a function of another external parameter, the gate charge $Q_g$ around the point $Q_g=0$. Consequently, the SSET behaves as a capacitance $C_G$ relative to the gate voltage $V_g=Q_g/C_g$. The capacitance value also depends on the phase over SSET. The C-SET configuration is created by connecting the SSET via the gate to a special resonance circuit (FIG. 1). The idea of the connection is that the resonance frequency of the entire circuit depends on the capacitance of the SSET, which, in turn, depends on the phase. Thus the connection is a rapid and sensitive phase detector. The principle of the C-SET can be considered inverse to that of the L-SET. In the L-SET, the inductance dependent on the gate charge is measured through the phase, whereas in the C-SET, the dependency between the capacitance and the phase is measured through the gate.

Measurement of Quantum Bits by Means of a C-SET

A C-SET is usable particularly in the measurement of charge-phase quantum bits or phase-quantum bits and also any imaginary quantum information storage that can be measured by means of the phase.

Figure 3:
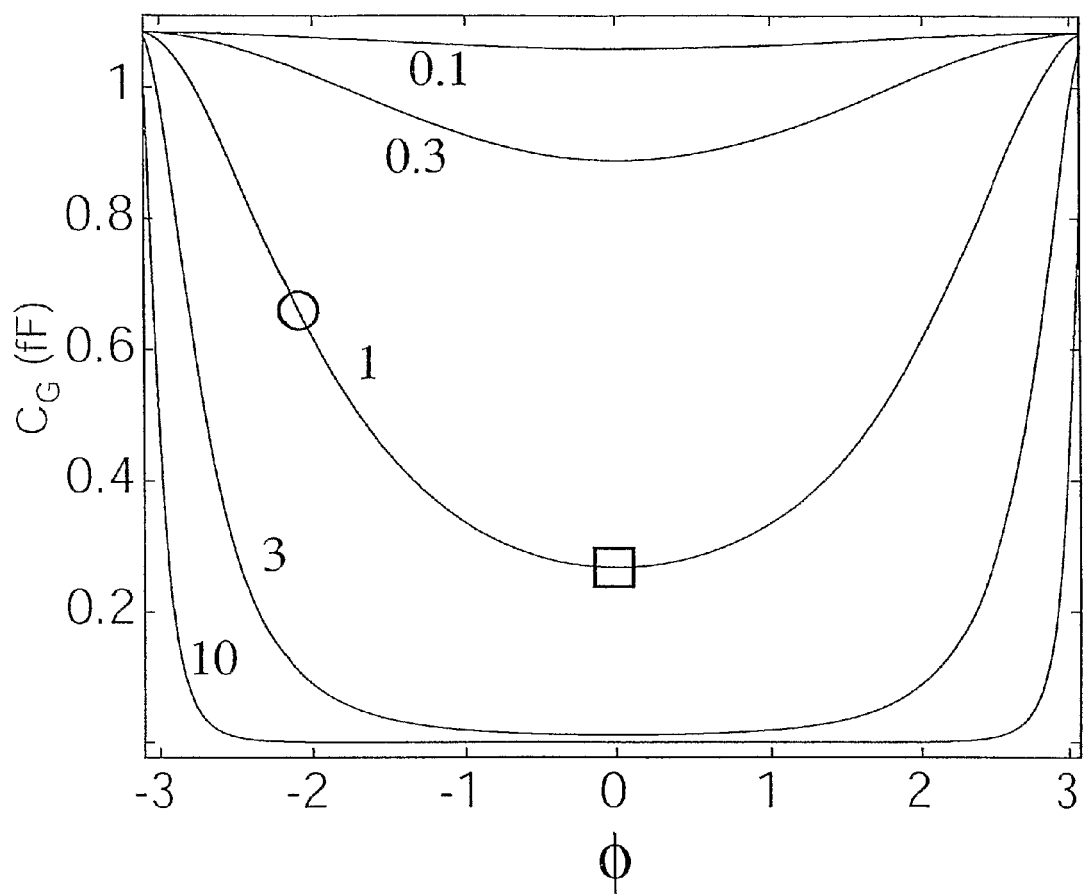
FIG. 3 plots the gate capacitance (Cg, in femtoFarads) versus $\phi$, illustrating the dependency between the capacitance and phase $\phi$, with each curve corresponding to the indicated value of the ratio $E_j/E_{cp}$, wherein $E_j$ is the Josephson energy.

Thus for instance, measurement of the charge-phase quantum bit can be performed as follows using a C-SET. The quantum bit and the C-SET are connected in parallel by means of a superconducting loop. The structure of the C-SET is selected with $E_J/E_{CP}$~1, so that the phase dependency of the capacitance is strong over the entire range $\phi=0-\pi$ (FIG. 3, curve "1"). The structure of the quantum bit is also selected with $E_J/E_{CP}$~1 as in the original embodiment of the measurement of the charge-phase quantum bit, resulting in the states |0> and |1> being associated with a supercurrent circulating into opposite directions in the loop.

Figure 4:
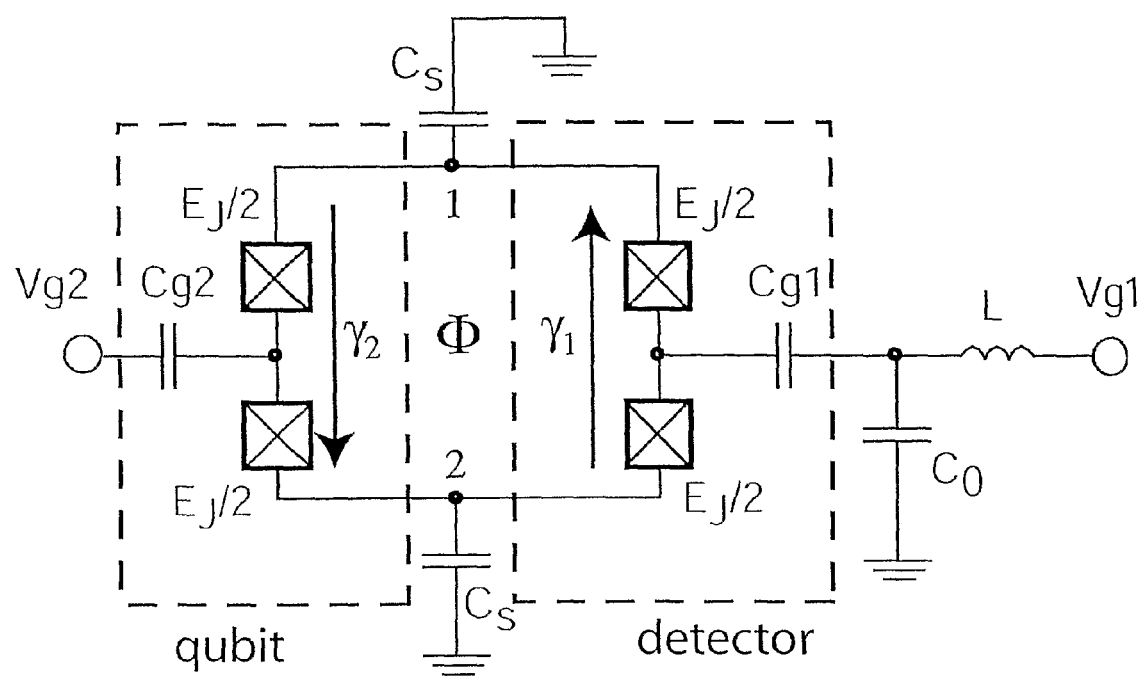
FIG. 4 illustrates an example embodiment of an apparatus according to the present invention for measuring a charge-phase quantum bit.

The quantum bit is adjusted by two controllers (FIG. 4): the electric current passing through the adjacent small conductive loop generates a magnetic field, which affects the current passing in the loop, and thus the phase over the quantum bit. In addition, the quantum bit has a capacitively connected gate, which serves for setting the appropriate point of operation and for performing high-frequency operations relating to quantum computation. The SSET pertaining to the C-SET-detector comprises a similar gate.

In the process of quantum computation, the phase both over the quantum bit and the SSET is zero. In order to obtain a signal separating the quantum bit states |0> and |1> from each other, the phase value should be changed from zero. In this situation, the quantum state of the quantum bit collapses according to quantum mechanics from the superposition to either of the basic states. The measurement is performed with the following combination of magnetic field pulses and gate voltage pulses. The normalised gate charge of the quantum bit $n_g=C_g V_g/(2e)$ is rapidly changed from the value 1 to the approximate value 0.37. Then the magnetic flux passing through the loop is increased from the value 0 to the approximate value 0.5 $\phi_0$. The gate voltage of the SSET included in the C-SET detector is consistently maintained at the value 0. Depending on the state of the quantum bit, the phase over the SSET after the operations is eventually either at the value 0 (a square in FIG. 3) or the value approx. −2 (a circle in FIG. 3). This corresponds to the capacitance difference 0.4 fF of the SSET with usual parameter values $C_0=0$, 15 pF, Q=20, $f_0=1$ GHz, $C_g=2$ fF, and to the signal/noise ratio 1 at a bandwidth of approx. 2.5 MHz when using a conventional preamplifier having a noise temperature of approx. 3 Kelvin. If a SQUID preamplifier were used, whose noise temperature can be 0.1 Kelvin, the signal/noise ratio 1 would be obtained even on a band of 75 MHz. The instrument above is assumedly made of aluminium. If stronger superconductors such as niobium were used, the bandwidths would be larger. Measurement of a quantum bit state by a C-SET detector with respect to the signal/noise ratio 1 can thus be performed in less than 0.4 microseconds even when using conventional preamplifiers.

This duration is clearly shorter than the period over which the measured state decomposes, and hence the measurement is feasible.

Phase Measurement in General

A C-SET is generally usable as a phase measuring instrument in any application. The phase is not only closely related to the current, but also to the magnetic flux $\phi_m=\phi\phi_0/(2\pi)$. A C-SET is thus also a sensitive instrument for measuring a magnetic field. In the measurement of a magnetic field, the ratio $E_J/E_{CP}$ should be at maximum, yielding a strong dependency between the capacitance and the phase. However, a C-SET made of aluminium requires $E_J/E_{CP}<10$ for $E_{CP}$ to still be above the temperature. This value (FIG. 3, curve "10") yields the magnetic flux sensitivity $10^{-5}$ $\phi_0/\sqrt{Hz}$, which is of the same order of magnitude as for conventional measuring instruments based on RF-SQUID. Nonetheless, the energy losses of a C-SET are smaller by several orders of magnitude and in principle, the size of the instrument can be minimised even to the size of a few atoms, thus allowing for infinite spatial dimensional accuracy.

In the foregoing Detailed Description, various features are grouped together in various example embodiments for ease of understanding. The many features and advantages of the present invention are apparent from the detailed specification, and, thus, it is intended by the appended claims to cover all such features and advantages of the described apparatus that follow the true spirit and scope of the invention. Furthermore, since numerous modifications and changes will readily occur to those of skill in the art, it is not desired to limit the invention to the exact construction, operation and examnle embodiments described herein. Accordingly. the invention may vary within the scope of the following claims.

The invention claimed is:

1. A method of determining a phase of a qubit having states defined by different phases, comprising:
    establishing the qubit in a superconducting single-electron transistor (SSET) having a gate, a ground and a capacitance;
    measuring the capacitance of the SSET between the gate and ground; and
    determining the phase from the measured gate-to-ground capacitance.

2. The method according to claim 1, wherein the qubit is a charge-phase qubit.

3. The method of claim 1, including:
    forming the SSET from first and second Josephson junctions;
    forming the qubit from third and fourth Josephson junctions;
    connecting the first Josephson junction of the SSET to the third Josephson junction of the qubit with a first conductor; and
    connecting the second Josephson junction of the SSET to the fourth Josephson junction of the qubit with a second conductor; and
    grounding said first and second conductors with said grounding carried out through a capacitance.

4. The method of claim 1, comprising connecting the SSET gate to a resonance circuit having a) an inductance connected to a control voltage, and b) a grounded capacitor.

5. The method of claim 4, wherein the resonance circuit has a resonance frequency, and including:
    determining the capacitance of the SSET by measuring the resonance frequency.

6. The method of claim 5, including using a magnetic flux to initiate said measuring.

7. The method of claim 4, including measuring the phase by registering a reflection of a voltage surge directed to an outer connection point of the resonance circuit.

8. A capacitive single-electron transistor (C-SET) detector circuit apparatus for measuring a phase of a qubit having states defined by different phases, comprising:
- a superconducting single-electron transistor (SSET) adapted to support the qubit, the SSET having a ground, a source, a drain, a gate having an associated gate voltage and an associated gate-to-ground capacitance ($C_G$), and a source-drain phase difference ($\phi$) that corresponds to said gate-to-ground capacitance and that corresponds to said qubit phase; and
- a resonance circuit electrically connected to the gate of the SSET and adapted to have a resonance frequency that depends on said gate-to-ground capacitance so that measuring the resonance frequency yields the qubit's state.

9. The apparatus of claim 8, wherein the resonance circuit includes:
- a grounded shunt capacitor; and
- an inductor connected to a control voltage.

* * * * *